US006859157B1

(12) United States Patent
Gunther

(10) Patent No.: US 6,859,157 B1
(45) Date of Patent: Feb. 22, 2005

(54) PROGRAMMABLE PRECISION CURRENT CONTROLLING APPARATUS

(75) Inventor: Andre Gunther, San Jose, CA (US)

(73) Assignee: Inovys Corporation, Pleasanton, CA (US)

( * ) Notice: Subject to any disclaimer, the term of this patent is extended or adjusted under 35 U.S.C. 154(b) by 0 days.

(21) Appl. No.: 10/859,642

(22) Filed: Jun. 2, 2004

Related U.S. Application Data

(63) Continuation of application No. 10/356,048, filed on Jan. 31, 2003, now Pat. No. 6,750,797.

(51) Int. Cl.[7] .......... H03M 1/66
(52) U.S. Cl. .......... 341/144
(58) Field of Search .......... 341/144

(56) References Cited

U.S. PATENT DOCUMENTS 4,490,634 A * 12/1984 Hareyama .......... 327/388
4,701,694 A * 10/1987 Penney et al. .......... 323/317
4,897,555 A * 1/1990 Reed .......... 307/32
5,530,399 A * 6/1996 Chambers et al. .......... 327/561
5,815,103 A * 9/1998 Comminges et al. .......... 341/144
6,157,332 A * 12/2000 Frank et al. .......... 341/144

OTHER PUBLICATIONS

Engineering Staff of Analog Devices, Analog–Digital Conversion Handbook, 1984, Editor Daniel Sheingold, Prentice– Hall, Third Edition, pp. 611–614.*

* cited by examiner

*Primary Examiner*—Howard L. Williams
(74) *Attorney, Agent, or Firm*—Murabito & Hao LLP

(57) ABSTRACT

The present invention is a circuit for controlling current. In one embodiment, the high reference voltage input of a digital to analog converter is coupled with a reference voltage source which provides a positive reference voltage. A resistive load is coupled to an output of the digital to analog converter and to a circuit output pin. A sensing device couples the circuit output pin with the low reference voltage input of the digital to analog converter and to a reference ground input of the voltage source. The positive reference voltage, low reference voltage, and reference ground voltage are changed in response to the sensing device detecting a change in the output voltage.

20 Claims, 13 Drawing Sheets

600

100

700

800

1000

PROGRAMMABLE PRECISION CURRENT CONTROLLING APPARATUS

CROSS REFERENCE TO EARLIER APPLICATIONS

This application is a continuation of application Ser. No. 10/356,048 filed 31 Jan. 2003, now U.S. Pat. No. 6,750,797.

FIELD OF THE INVENTION

The present invention relates to the field of current sink and current source circuits. More specifically, embodiments of the present invention are directed to precision programmable current controlling devices.

BACKGROUND OF THE INVENTION

Programmable current sources are some of the most versatile components used in analog technology. They can be used in a variety of applications including analog computation, offset cancellation, parameter adjustment measurements, characterization of devices, driving actuators, and in Automatic Test Equipment (ATE).

In ATE applications, precise programmable current sources are necessary for precision parametric measurement units and integrated circuit quiescent current (IDDQ) measurements. The operating parameters in these applications necessitate precise current control, because the ATE system may be used as the reference for testing integrated circuits (ICs). Specifically, it has been known that manufacturing defects in the semiconductor fabrication process can be detected by precise measurement of current.

One of the most common implementations of a current source couples an operational amplifier, also referred to as an "op-amp", with a transistor and a resistor. The polarity of the output current distinguishes current sinks, current sources, and combined current sink/sources. A current sink draws current like a load and can only have current flowing in via its output pin. A current source can only have current flowing out of its output pin. A current sink/source may have current flowing into or flowing out of its output pin, that is, current may be measured as a negative or positive value.

FIG. 1 is a diagram of an exemplary prior art programmable current sink 100. In FIG. 1, a reference voltage supply (REF) 101 is coupled with a digital-to-analog converter (DAC) 102. The output of DAC 102 is coupled with the non-inverting input 110 of an op-amp 103. The output of op-amp 103 is coupled with a resistor 105 through the gate of transistor 104. In FIG. 1, the inverting input 111 of op-amp 103 is coupled with the source of transistor 104. Op-amp 103 regulates the gate of transistor 104 so that the voltage drop across resistor 105 is essentially the same as the voltage output by DAC 102. In other words, there is a 0 volts difference in potential between non-inverting input 110 and inverting input 111. The reference voltage supplied by reference voltage supply 101 is regulated by DAC 102 according to the digital bit value to which it is set. Thus, a set voltage ($V_{SET}$) is output from DAC 102 referenced to ground and which is sed to regulate the amount of current flowing into current sink 100 via output pin 120. The current flowing through resistor 105 can be derived by the equation:

$$I=V_{prog}/R$$

where R is the resistance value of resistor 105, $V_{prog}$ is the program voltage supplied by DAC 102 as seen across resistor 105. The minimum output voltage for current sink 100 can be expressed by the equation:

$$V_{out}(\mathrm{min})=V_{prog}+V_{DS}(sat).$$

$V_{DS}$(sat) is the saturation voltage of transistor 104. If a high impedance load, connected to the output of current sink 100, generates a voltage below $V_{out}$(min) the current source will become unregulated. $V_{out}$(min) is directly proportional to the programmed current and has an upper limit of:

$$V_{out}(\mathrm{min})=V_{ref}+V_{DS}(sat).$$

$V_{ref}$ is the maximum output voltage of DAC 102 which is bounded by its REF_LO, in this Figure tied to ground, and its REF_HI, in this Figure supplied by reference voltage supply 101.

Current sinks of the types just described have had several problems and limitations associated with their use. For example, one drawback of system 100 is the limitation on output voltage as described above. One method for preventing the DAC from putting out voltages above a certain limit (e.g. $V_{ref}/2$), is by limiting the use of the programming bits available to the DAC. However, this results in a reduction in resolution for this type of current sink.

A second possibility would be to reduce the reference Voltage $V_{ref}$. Since errors due to noise, offset, and drift essentially stay the same, they may become significant in comparison to the desired output voltage. Thus the accuracy of the voltage output by DAC 102 is then determined by the error signals rather than least significant bit used to program the DAC. Thus the ability of the prior art as shown in current sink 100 to precisely control current is limited in applications requiring low output voltage.

FIG. 2 shows an exemplary prior art implementation of an automatic test equipment system 200. A digital signal processor (DSP) 202 is coupled with an analog to digital converter (ADC) 201 and with a plurality of digital to analog converters 102. DSP 202 reads data from ADC 201 and sends digital signals to the DACs which are used to control the output from the DACs. Typically, automatic test systems are used to perform parametric testing of integrated circuits. This necessitates precise control of current and voltage in order to obtain accurate test results and to prevent damage to the circuits being tested.

As mentioned above, the program voltage can be lowered by limiting the number of programming bits used by DAC 102. For example, DSP 202 can send digital signals to DAC 102 that only cause DAC 102 to utilize 4 of its programming levels. While this can effectively limit the voltage output from DAC 102, it also reduces the dynamic range of the DAC and limits the ability to precisely control current in some applications.

The exemplary prior art of FIG. 1 can also be reconfigured as shown in FIG. 3 to create a current source. In FIG. 3, a reference voltage supply (REF) 304 is coupled with a digital-to-analog converter (DAC) 303. The output of DAC 303 is coupled with the non-inverting input of an op-amp 302. The output of op-amp 302 is coupled with a resistor 305 through the gate of transistor 306. In FIG. 3, the inverting input of op-amp 302 is coupled with the source of transistor 306.

The reference voltage supplied by reference voltage supply 304 is regulated by DAC 303 according the digital bit value to which it is set. The output current is driven by the reference voltage supplied by reference voltage supply 304. The feedback to the inverting input of op-amp 302 adjusts the gate voltage so that the sensed voltage matches the output of the DAC.

$V_{DS}$ (sat) is the saturation voltage of transistor 306. $V_{ref}$ is the maximum output voltage of DAC 303 which is bounded by its REF_HI. One drawback to the current source design of FIG. 3 is that the current range desired by entering the highest values of binary code to the DAC may be unreachable. For example, the maximum value of $V_{ref}$ output by the DAC may not be applied across the resistor 305 because there is necessarily a voltage across the transistor 306. This translates into a negative output voltage which might not be tolerable by the load. Thus, the maximum $I_{out}$ current represented by setting the DAC to its full limit is not attainable.

FIG. 4 is a diagram of an exemplary current sink/source. Current sink/source 400 exhibits the same limitations as current sink 100 of FIG. 1 with respect to low output voltage (e.g., susceptibility to error and loss of resolution). In addition, another problem of the prior art is that to provide both current sink and current source capability, DAC 403 must provide both positive voltage when acting as a current source and a negative voltage when acting as a current sink or vice versa. Each programming bit of the DAC 403 now controls twice as much voltage, thus further aggravating the loss of resolution due to the unavailability of the highest order bits and reducing the precision with which current can be controlled. Alternatively, to realize the same level of precision as the current sink of FIG. 1, 2 DACs or a 2 output DAC (e.g., DAC 403 of FIG. 4) are needed, thus increasing the cost of the circuit. However, the use of the programming bits available to the DAC is still limited which results in a reduction in resolution for this type of current sink/source.

FIG. 5 is a diagram of an exemplary prior art precision current sink/source 500 that can overcome the problem of constrained voltage swing exhibited in current sink/source 400. In FIG. 5, differential amplifier 501 is used in conjunction with feedback amplifier 502 to control current. The output voltage generated by the load external to the system attached to pin 540 is sensed by feedback amplifier 502 and fed back into the reference input of differential amplifier 501. As the output voltage changes due to varying load impedance, differential amplifier 501 adjusts the voltage supplied to resistor 504. The formula for the voltage across resistor 504 can be expressed as:

$$V_{prog}=V_{set}-V_{out},$$

Where $V_{prog}$ is the voltage drop across resistor 504 and $V_{out}$ is the output voltage at output pin 540. As $V_{out}$ changes, the feedback causes $V_{set}$ to closely track these changes, thus maintaining the same $V_{prog}$ across the resistor.

However, the part count in precision current sink/source 500 is higher due to the additional resistors and op-amp in differential amplifier 501. Thus, the overall precision of current sink/source 500 is affected by these additional parts. The higher part count also makes current sink/source 500 more expensive and more complex for manufacturers to fabricate.

SUMMARY OF THE INVENTION

Accordingly, a need exists for an apparatus that can control electrical current more precisely in a number of various configurations. An additional need exists for an apparatus that meets the above stated need and that utilizes fewer components. Furthermore, a need exists for an apparatus that meets the above stated needs while reducing a manufacturer's fabrication costs.

Embodiments of the present invention provide various apparatus that precisely control electrical current. Additionally, embodiments of the present invention precisely control electrical current and utilize fewer components than prior art implementations. Furthermore, embodiments of the present invention cost less for a manufacturer to fabricate than prior art implementations. In one embodiment, the current control devices can be used in ATE (Automatic Test Equipment) systems, as an example.

In one embodiment, the high reference voltage input of a digital to analog converter is coupled with an output voltage source which provides a positive reference voltage for a current control device. A resistive load is coupled to an output of the digital to analog converter and to a circuit output pin. A sensing device couples the circuit output pin with the low reference voltage input of the digital to analog converter and to a reference ground input of the voltage source. The positive reference voltage, low reference voltage, and reference ground voltage are changed in response to the sensing device detecting a change in the output voltage at the circuit output pin.

Embodiments of the present invention can be configured as a current source, a current sink, a current sink/source, a precision current sink/source with adjustable range, and an adaptive range precision current sink/source. The present invention reduces possible error sources by reducing the part count and makes use of the full dynamic range of the Digital to Analog Converter (DAC) by shifting its reference voltage as the output voltage varies.

More specifically, the proposed current source implementation makes use of the full scale range of the DAC and has no implicit limitations on the output voltage. It has fewer parts than prior art implementations and is therefore more accurate since it has fewer possible sources of error. Since fewer parts are utilized, the embodiments of the present invention are more cost effective. Embodiments of the present invention are especially cost effective in ATE systems, for example, where a large number of precision measurement units are required which necessitates a large number of precision programmable current sources as well. Thus, even a small cost savings per unit can be multiplied into large cost savings per system.

BRIEF DESCRIPTION OF THE DRAWINGS

The accompanying drawings, which are incorporated in and form a part of this specification, illustrate embodiments of the present invention and, together with the description, serve to explain the principles of the invention. Unless specifically noted, the drawings referred to in this description should be understood as not being drawn to scale.

DETAILED DESCRIPTION OF THE PREFERRED EMBODIMENT

Reference will now be made in detail to embodiments of the present invention, examples of which are illustrated in the accompanying drawings. While the present invention will be described in conjunction with the following embodiments, it will be understood that they are not intended to limit the present invention to these embodiments alone. On the contrary, the present invention is intended to cover alternatives, modifications, and equivalents which may be included within the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Figure 6:
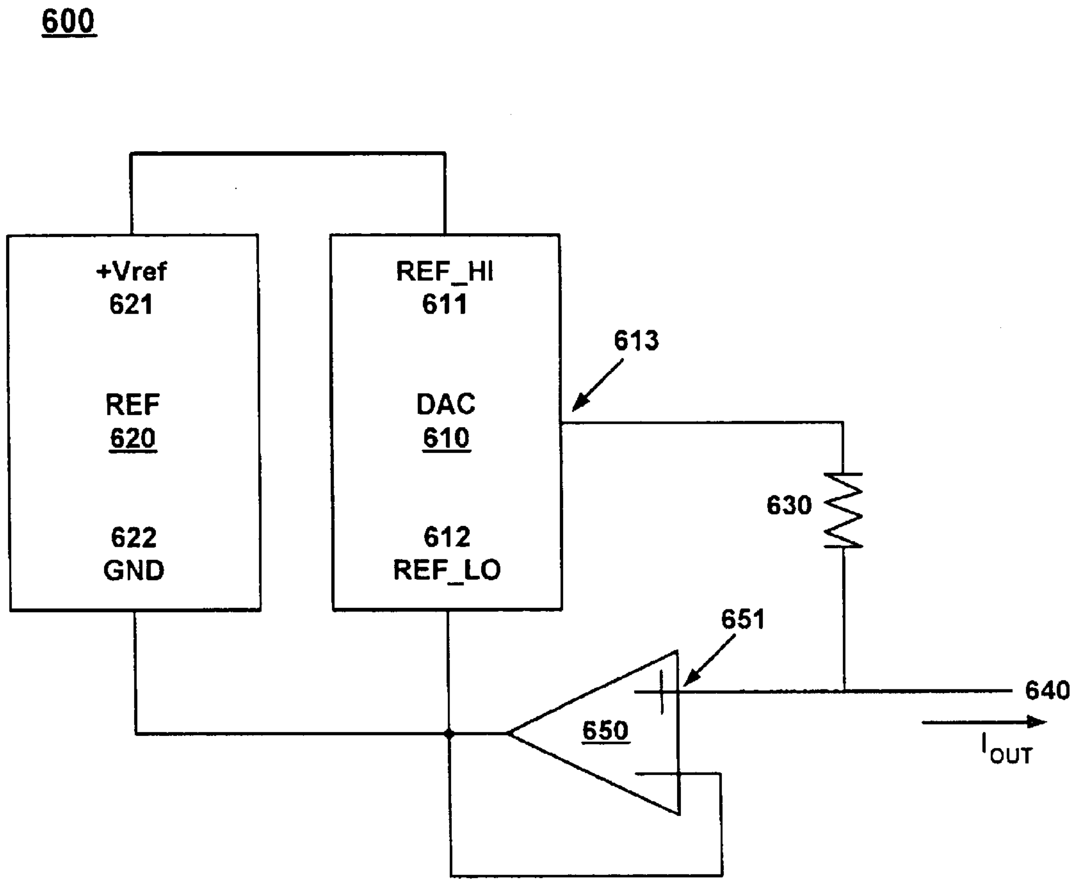
FIG. 6 is a diagram of an exemplary precision current source in accordance with embodiments of the present invention.

FIG. 6 is a diagram of an exemplary precision current source in accordance with embodiments of the present invention. Current source 600 comprises a digital to analog converter 610 coupled with a voltage reference 620. Voltage reference 620 is for providing a stable voltage to DAC 610. In the embodiment of FIG. 6, an output 621 ($+V_{ref}$) of voltage reference 620 is coupled with a high reference voltage input terminal 611 (REF_HI) of DAC 610 and supplies a positive reference voltage for DAC 610. The REF_LO 612 of DAC 610 and the GND 622 of REF 620 are changed by the sensing device 650 detecting a change in the output voltage at the circuit output pin 640.

A resistor 630 is coupled with an output 613 of DAC 610 and with a circuit output pin 640. A sensing device 650 (e.g., a feedback amplifier) is coupled with circuit output pin 640 (e.g., at non-inverting input 651) and detects the output voltage at circuit output pin 640. The formula for the voltage across resistor 630 can be expressed as:

$$V_{prog}=V_{set}-V_{out}.$$

Where $V_{set}$ is the output voltage of DAC 610 applied to resistor 630, $V_{prog}$ is the voltage drop across resistor 630, and $V_{out}$ is the output voltage at circuit output pin 640 and the non-inverting input of sensing device 650. The output of sensing device 650 is coupled with DAC 610 at low reference voltage input terminal (REF_LO) 612, and with voltage reference 620 at reference low input terminal (GND) 622. In one embodiment, reference low input terminal 622 is a local ground for voltage reference 620 and is used as a reference for the positive reference voltage sent to DAC 610.

The output voltage at circuit output pin 640 is sensed by sensing device 650 and is used to shift the reference ground voltage of voltage reference 620 and the low reference voltage of DAC 610. In so doing, as the output voltage at circuit output pin 640 varies, the reference ground voltage of voltage reference 620, as well as the high reference voltage and low reference voltage of DAC 610 are shifted with it.

For example, a 2 volt output voltage at circuit output pin 640 causes a reference ground voltage of 2 volts to be delivered to reference low input terminal 622 of voltage reference 620 and to low reference voltage input terminal 612 of DAC 610. Assuming a 5 volt reference voltage is being delivered by voltage reference 620 to DAC 610, the voltage delivered to high reference voltage input terminal 611 of DAC 610 is 7 volts. If the output voltage at circuit output pin 640 drops to 1.5 volts, this causes a corresponding voltage drop at reference low input terminal 622, low reference voltage input terminal 612, and output 621 of voltage source 610 (and thus, at high reference voltage input terminal 611). Thus, the voltage delivered to high reference voltage input terminal 611 of DAC is now 6.5 volts. However, the voltage range of DAC 610 remains 5 volts. The voltage across resistor 630 ($V_R$) is derived from the formula:

$$V_R = V_{REF} \cdot \frac{\sum_{i=0}^{M} N_i \cdot 2^i}{2^M}$$

In this example, $N=(N_M, N_{M-1}, \ldots, N_1, N_0)$ is the digital input code (e.g., $N_i$ is a programming bit) and M is the number of bits of the DAC. Depending on the selection of the reference voltage from voltage reference 620 and the size of the resistor 630, the maximum current can be set, thus using the full range of the DAC.

Thus, embodiments of the present invention provide greater precision in controlling current and allow use of the full voltage range of the DAC while reducing circuit complexity. By coupling sensing device 650 directly with DAC 610, the circuit complexity for current source 600 is reduced. This introduces fewer potential sources of error into the circuit and facilitates more precise control of current. The embodiments of the present invention facilitate high output voltage swing without reducing the reference voltage. This minimizes the relative effects of noise, voltage offset and voltage offset drift which are more pronounced when the reference voltage is reduced. The embodiments of the present invention are also more compact and less expensive to fabricate due to its reduced circuit complexity which is advantageous in implementations requiring large numbers of current sources.

Figure 1:
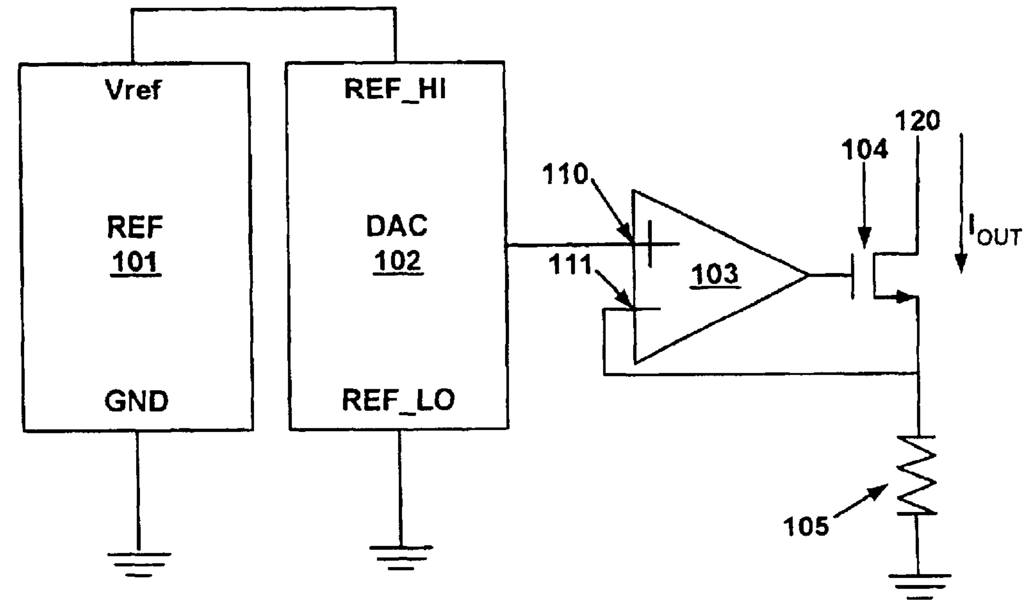
FIGURE 1 (PRIOR ART)
FIG. 1 is a diagram of an exemplary prior art current sink.
Figure 2:
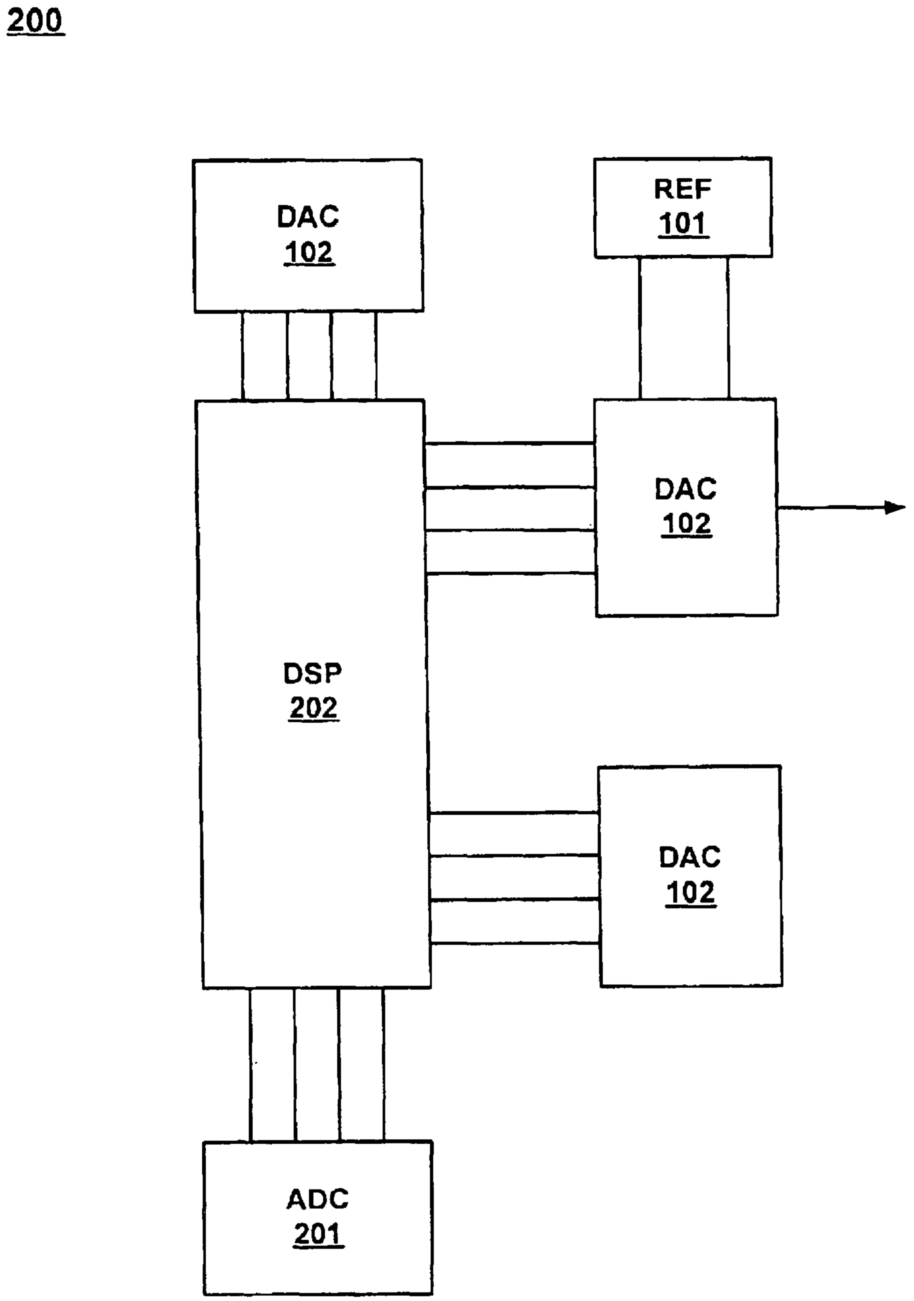
FIGURE 2 (PRIOR ART)
FIG. 2 is a diagram of an exemplary prior art circuit showing how programming bits from a digital signal processor are used to control the analog output from a DAC.
Figure 3:
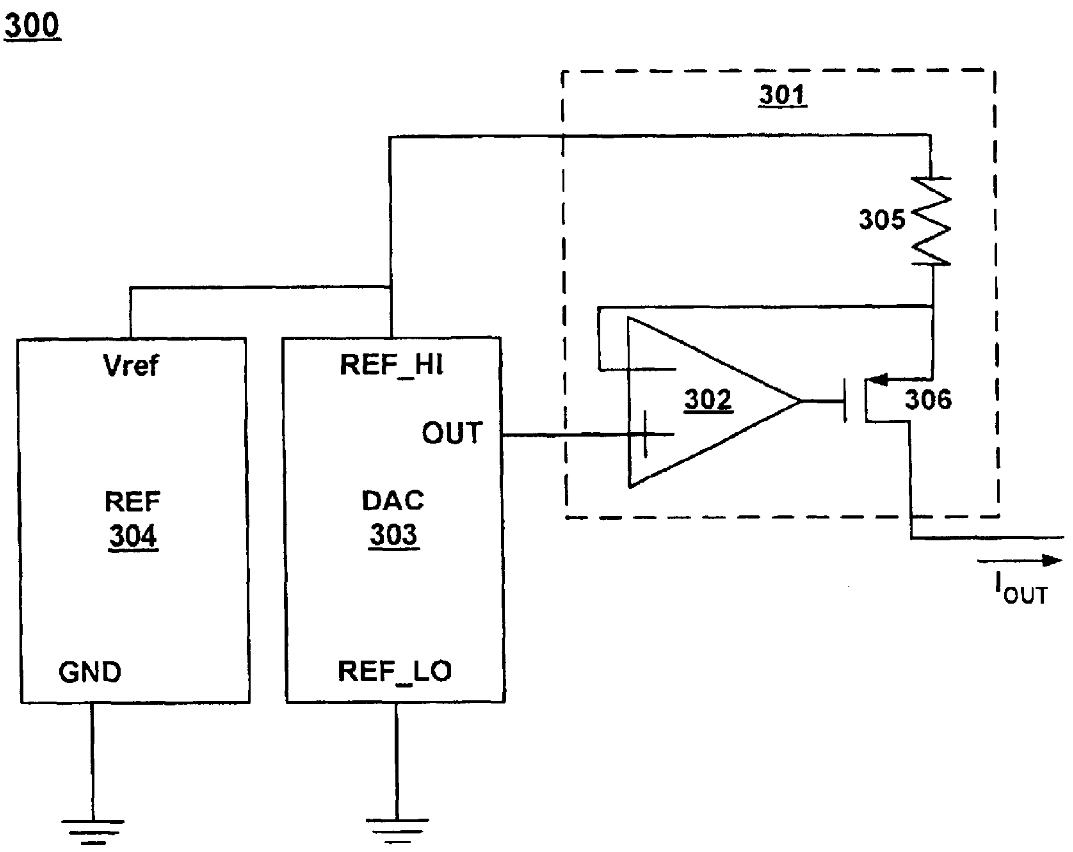
FIGURE 3 (PRIOR ART)
FIG. 3 is a diagram of an exemplary prior art current source.

In one exemplary configuration, the operational amplifier of sensing device 650 utilizes a field-effect transistor (FET) input stage, otherwise the input bias current can result in an error. An auto-zero amplifier or, for DC supplies, a chopper amplifier may be used to reduce offset, drift, and noise. If a precision resistor with a low temperature coefficient (TC) is used, the dominating error source will be the DAC itself and the reference voltage. However, since the full programming range of the DAC is being used, greater accuracy is realized in the embodiment of FIG. 6 than in, for example, the implementation depicted in FIG. 3. Additionally, the circuit complexity of the embodiments of the present invention result in fewer possible sources of induced error in the system.

Figure 7:
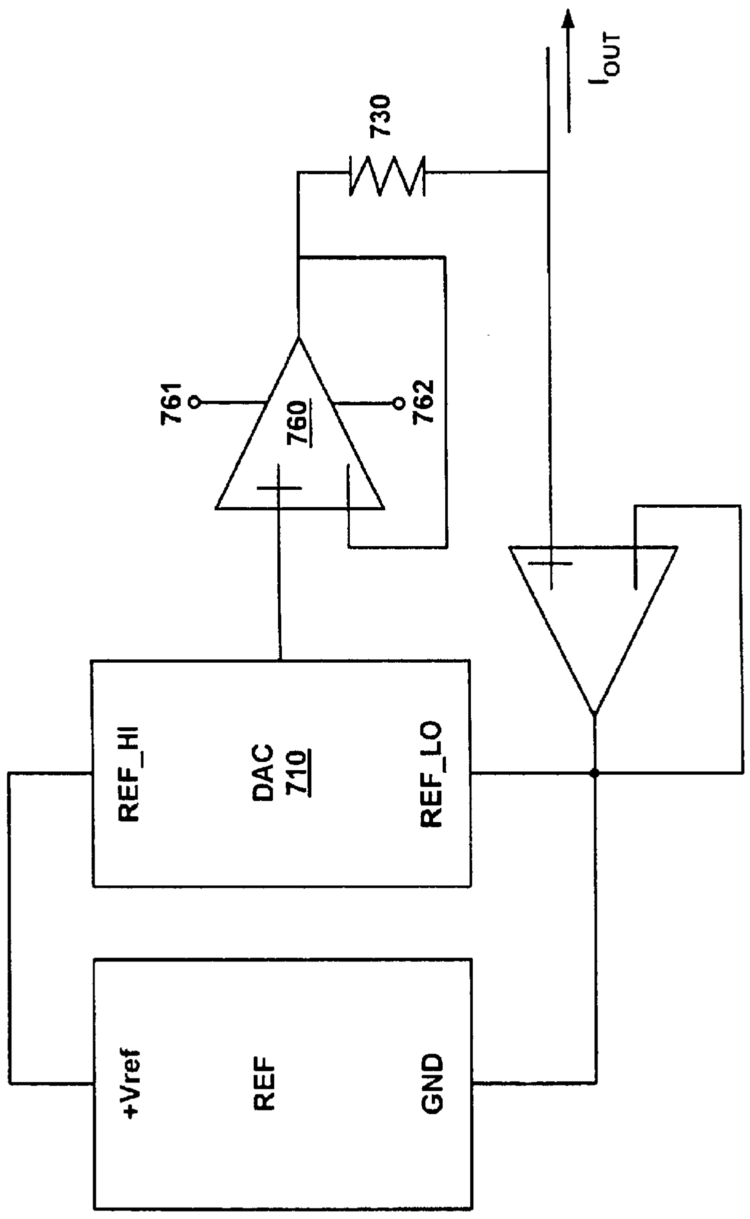
FIG. 7 is a diagram of an exemplary current boosted precision current source in accordance with embodiments of the present invention.

FIG. 7 is a diagram of an exemplary current boosted precision current source 700 in accordance with embodiments of the present invention. The implementation described in FIG. 6 drives the output current directly out of the DAC, and is therefore better suited for low current sinks/sources. If a higher current is required (e.g., a current that introduces distortion in the DAC output transfer function), a buffer 760 can be used to keep the output current of the DAC low. In FIG. 7, buffer 760 couples DAC 710 with resistor 730. Additional current is provided using positive voltage supply input 761 and negative voltage supply input 762. In one embodiment, buffer 760 should exhibit low offset, low drift, low noise, high common mode rejection, and high power supply rejection characteristics. Since the output voltage of DAC 710 is typically a low impedance source, a bipolar amplifier may be used to improve noise performance.

The principle of shifting the reference voltage around the output voltage can be applied to current sinks as well. FIG.

Figure 8:
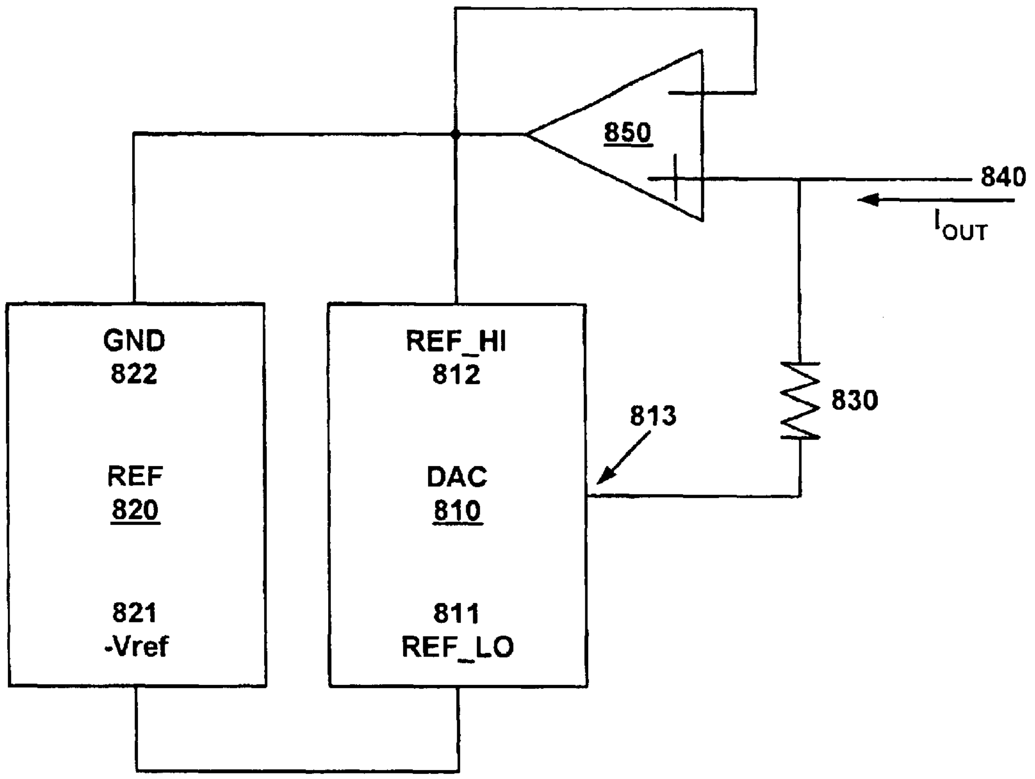
FIG. 8 is a diagram of an exemplary precision current sink in accordance with embodiments of the present invention.

8 is a diagram of an exemplary precision current sink 800 in accordance with embodiments of the present invention. In FIG. 8, a digital to analog converter (DAC) 810 is coupled with a voltage reference 820. In the embodiment of FIG. 8, an output 821 ($-V_{ref}$) of voltage reference 820 is coupled with a low reference voltage input 811 (REF_LO) of DAC 810 and supplies a negative reference voltage. A resistor 830 is coupled with an output 813 of DAC 810 and with a circuit output pin 840. A sensing device 850 (e.g., a feedback amplifier) is coupled with circuit output pin 840 (e.g., via non-inverting input 841) and detects the output voltage at circuit output pin 840. Sensing device 840 is also coupled with DAC 810 at high reference voltage input (REF_HI) 812, and with voltage reference 820 at reference ground input (GND) 822.

Again, reference ground input 822 is a local ground for voltage reference 820 and is used as a reference for the negative reference voltage sent to DAC 810. The output voltage at circuit output pin 840 is sensed by the operational amplifier of sensing device 850 and is used to shift the reference ground voltage of voltage reference 820 and the high reference voltage of DAC 810. In so doing, as the output voltage at circuit output pin 840 varies, the reference ground voltage of voltage reference 820, as well as the high reference voltage and low reference voltage of DAC 810 are shifted with it.

In embodiments of the present invention, a current boosted precision current sink may be implemented by, for example, coupling a buffer between DAC 810 and resistor 830 in a manner similar to that of FIG. 7 if a higher current in needed.

Figure 9:
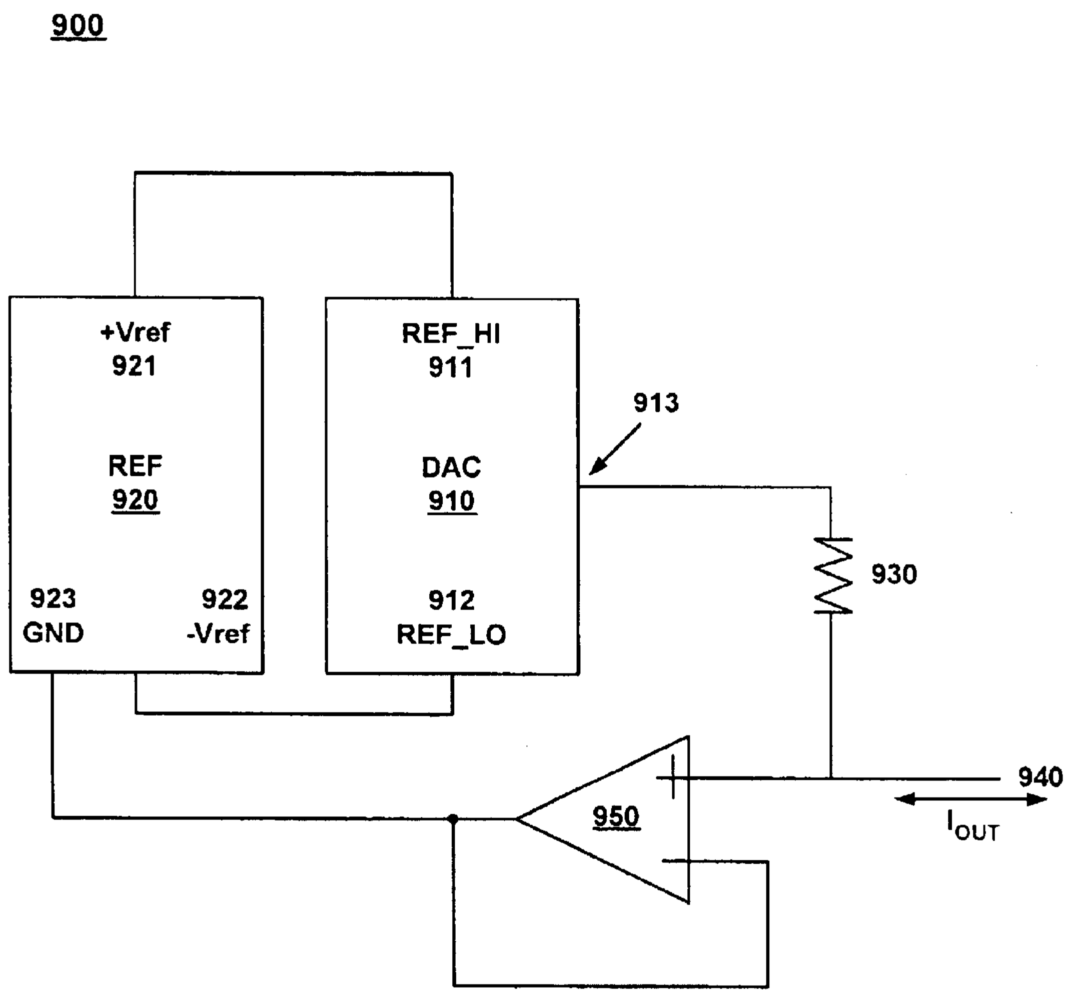
FIG. 9 is a diagram of an exemplary precision current sink/source in accordance with embodiments of the present invention.

FIG. 9 is a diagram of an exemplary precision current sink/source 900 in accordance with embodiments of the present invention. In FIG. 9, a digital to analog converter 910 is coupled with a dual reference voltage source 920. In one embodiment, a positive reference voltage is supplied to DAC 910 by coupling a first output 921 ($+V_{ref}$) with a first reference input 911 (REF_HI) of DAC 910 which is the high reference input for DAC 910. A negative reference voltage is supplied to DAC 910 by coupling a second output 922 ($-V_{ref}$) with a second reference input 912 (REF_LO) of DAC 910 which is the low reference input for DAC 910. A resistor 930 is coupled with an output 913 of DAC 910 and with a circuit output pin 940.

A sensing device 950 (e.g., a feedback amplifier) is coupled with circuit output pin 940 and with a reference ground input 923 (GND) of dual reference voltage source 920. The output voltage at circuit output pin 940 is sensed by sensing device 950 and is used to shift the reference ground voltage of dual reference voltage source 920. Thus as the output voltage at circuit output pin 940 varies, the reference ground voltage of dual reference voltage source 920 is shifted with it. This in turn causes the positive reference voltage and the negative reference voltages supplied to DAC 910 to be similarly shifted.

In the embodiment of FIG. 9, two reference voltages are provided to DAC 910 (e.g., a positive voltage from $+V_{ref}$ and a negative voltage from $-V_{ref}$) and both are referenced to the same ground voltage. This common ground voltage changes as the output voltage at circuit output pin 940 changes. In one embodiment, dual reference voltage source 920 comprises a first reference voltage source and a second reference voltage source that are tied together, one with its reference ground terminal to the reference voltage terminal of the other reference voltage source and both accessing a common ground.

Figure 10:
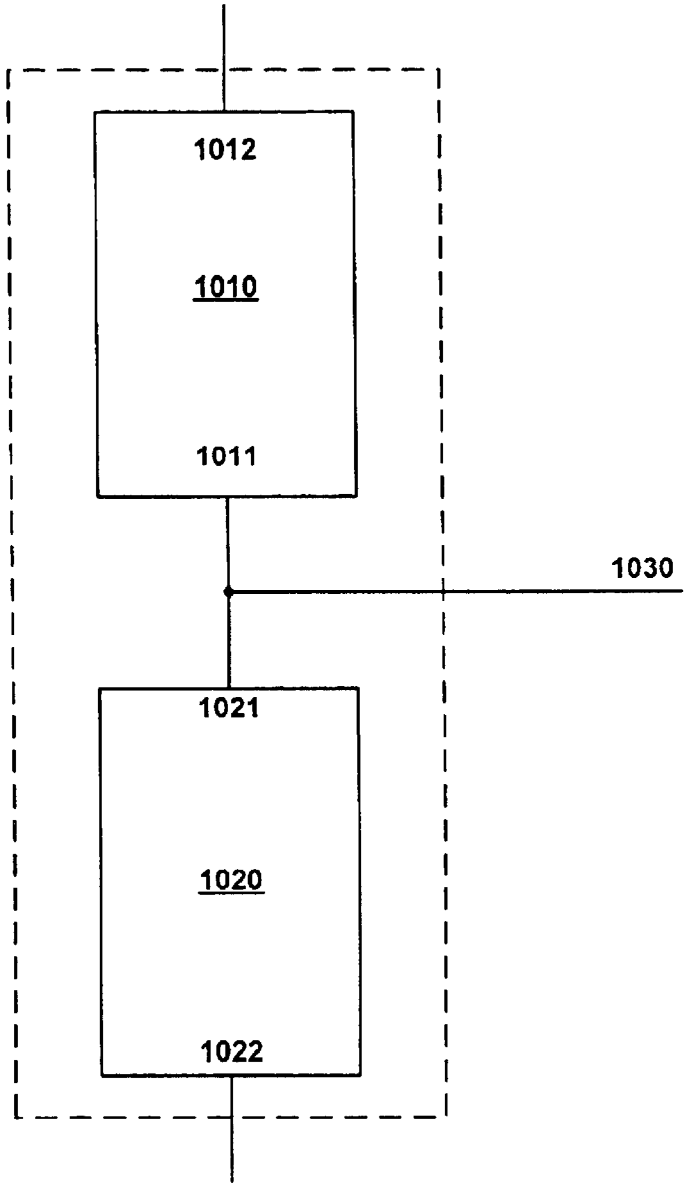
FIG. 10 is a diagram of an exemplary voltage reference used in accordance with embodiments of the present invention.

FIG. 10 is a more detailed view of one implementation of dual reference voltage source 920 which may be utilized in embodiments of the present invention. The potential of pin 1030 corresponds to that of pin 923 of FIG. 9. It is appreciated that the potential of $+V_{ref}$ 921 and $-V_{ref}$ 922 may be adjusted in tandem. In FIG. 10, a first reference voltage source 1010 is coupled with a second reference voltage source 1020. A reference ground terminal 1011 of first reference voltage source 1010 is coupled with a reference ground input 1030 of dual reference voltage source 920 (e.g., reference ground input 923 of FIG. 9) and with a reference voltage terminal 1021 of second reference voltage source 1020. A reference voltage terminal 1012 of first reference voltage source 1010 (e.g., $+V_{ref}$ 921 of FIG. 9) is coupled with first reference voltage input 911

Reference voltage terminal 1021 of second reference voltage source 1020 is also coupled with reference ground input 1030 of dual reference voltage source 920. Additionally, a reference ground terminal 1022 of second reference voltage source 1020 (e.g. $-V_{ref}$ 922 of FIG. 9) is coupled with second reference input 912(REF_LO) of DAC 910. First reference voltage source 1010 provides a positive reference voltage for DAC 910 while second reference voltage source 1020 provides a negative reference voltage. Reference ground input 1030 provides a common reference voltage for reference voltage sources 1010 and 1020 that is shifted as the output voltage at circuit output pin 940 shifts. Assuming first reference voltage source 1010 and second reference voltage source 1020 both provide 5 volts, first reference voltage source 1010 provides a reference voltage to DAC 910 that is 5 volts greater than the output voltage at circuit output pin 940. Similarly, second reference voltage source 1020 provides a reference voltage that is 5 volts less than the output voltage at circuit output pin 940. As the output voltage at circuit output pin 940 varies, the reference ground voltage of dual reference voltage source 920 is similarly shifted. This in turn causes the positive reference voltage and the negative reference voltage supplied to DAC 910 to be similarly shifted.

In embodiments of the present invention, a current boosted precision current sink/source may be implemented by, for example, coupling a buffer between DAC 910 and resistor 930 in a manner similar to that described in FIG. 7 if a higher current is needed.

Figure 4:
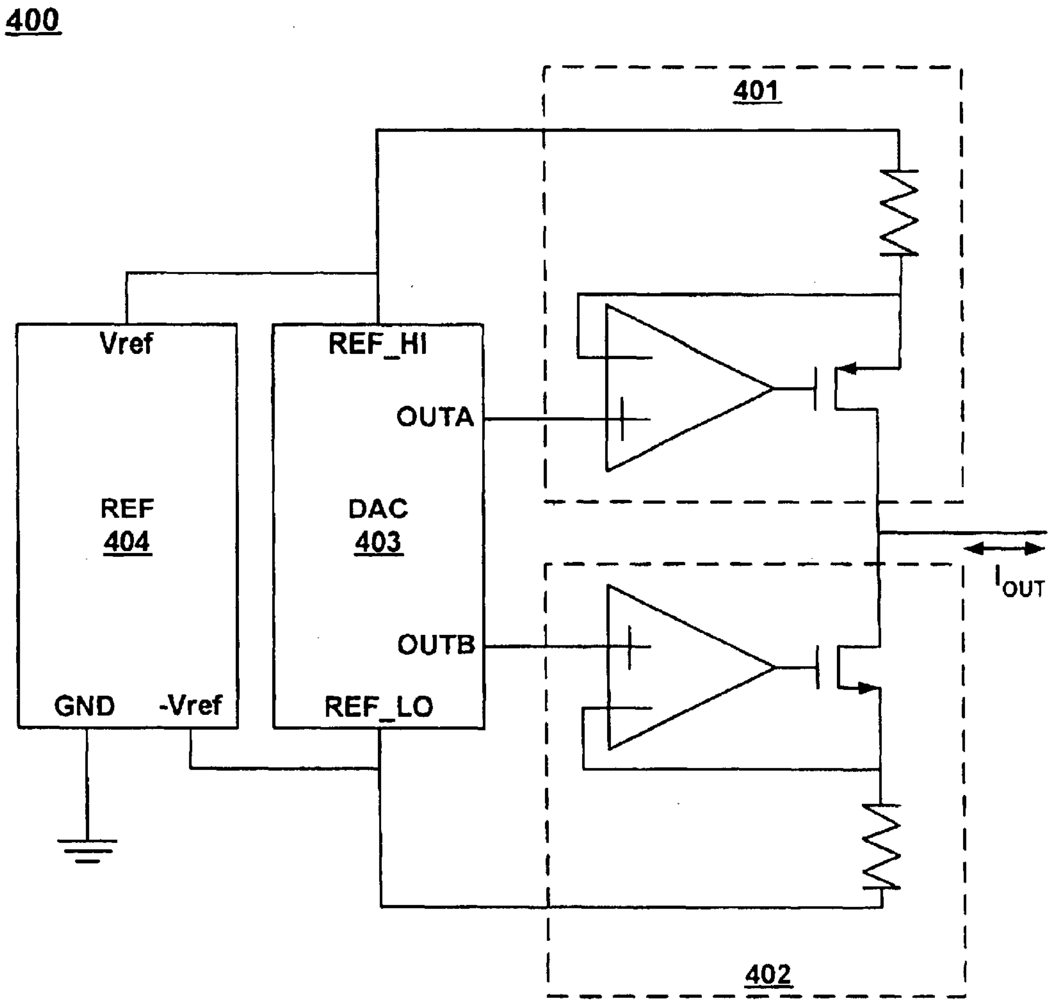
FIGURE 4 (PRIOR ART)
FIG. 4 is a diagram of an exemplary prior art current sink/source.
Figure 5:
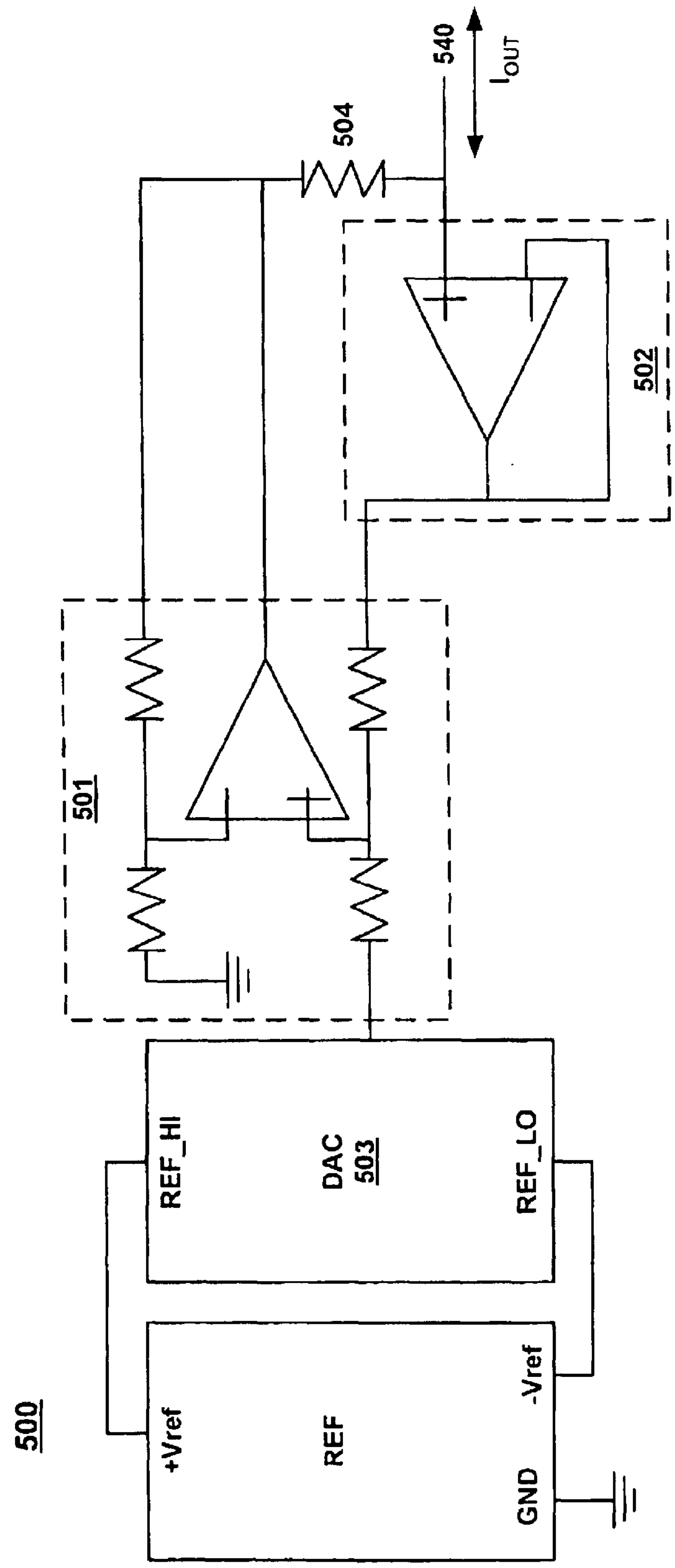
FIGURE 5 (PRIOR ART)
FIG. 5 is a diagram of an exemplary prior art precision current sink/source.

The embodiment of FIG. 9 is advantageous over prior art current sink/source implementations because the full resolution of the DAC is available when used to sink or source current. In addition, when $V_{out}$ is varying due to shifting load, $V_{prog}$ is maintained, again without loss of resolution of the DAC. In the prior art implementation of FIG. 4, the full range of the DAC could not be used when providing positive and negative output current since this also led to positive and negative output voltages (e.g., during continuity testing in ATE applications). While this problem can be overcome in the implementation of FIG. 5, a higher part count is required which introduces more sources of error into the circuit, thus reducing the overall precision with which current can be controlled. Additionally, the higher part count makes current sink/source 500 more complex for manufacturers to fabricate, thus making the device more expensive.

Figure 11A:
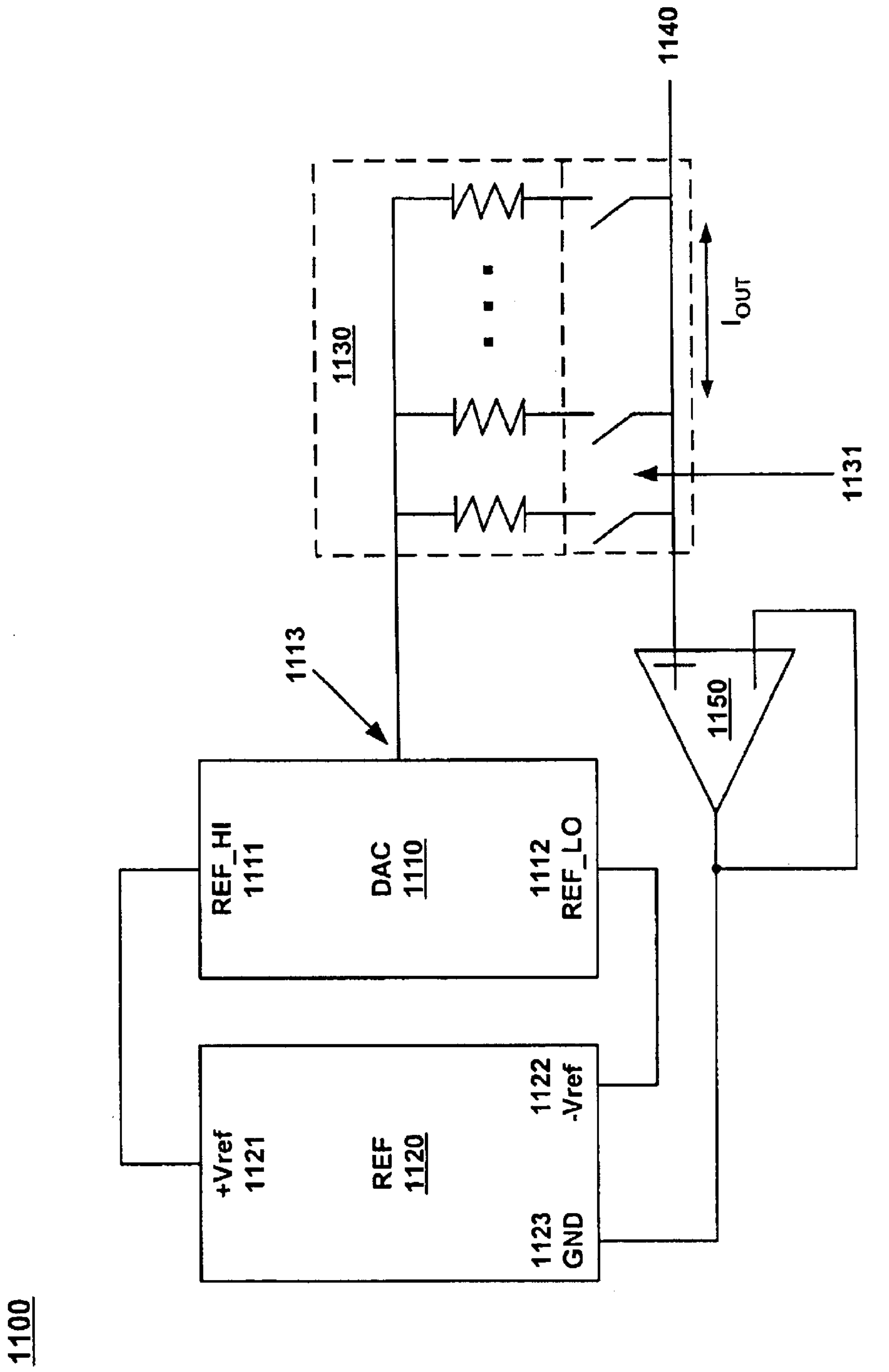
FIG. 11A is a diagram of an exemplary precision current sink/source with selectable ranges in accordance with embodiments of the present invention.
Figure 11B:
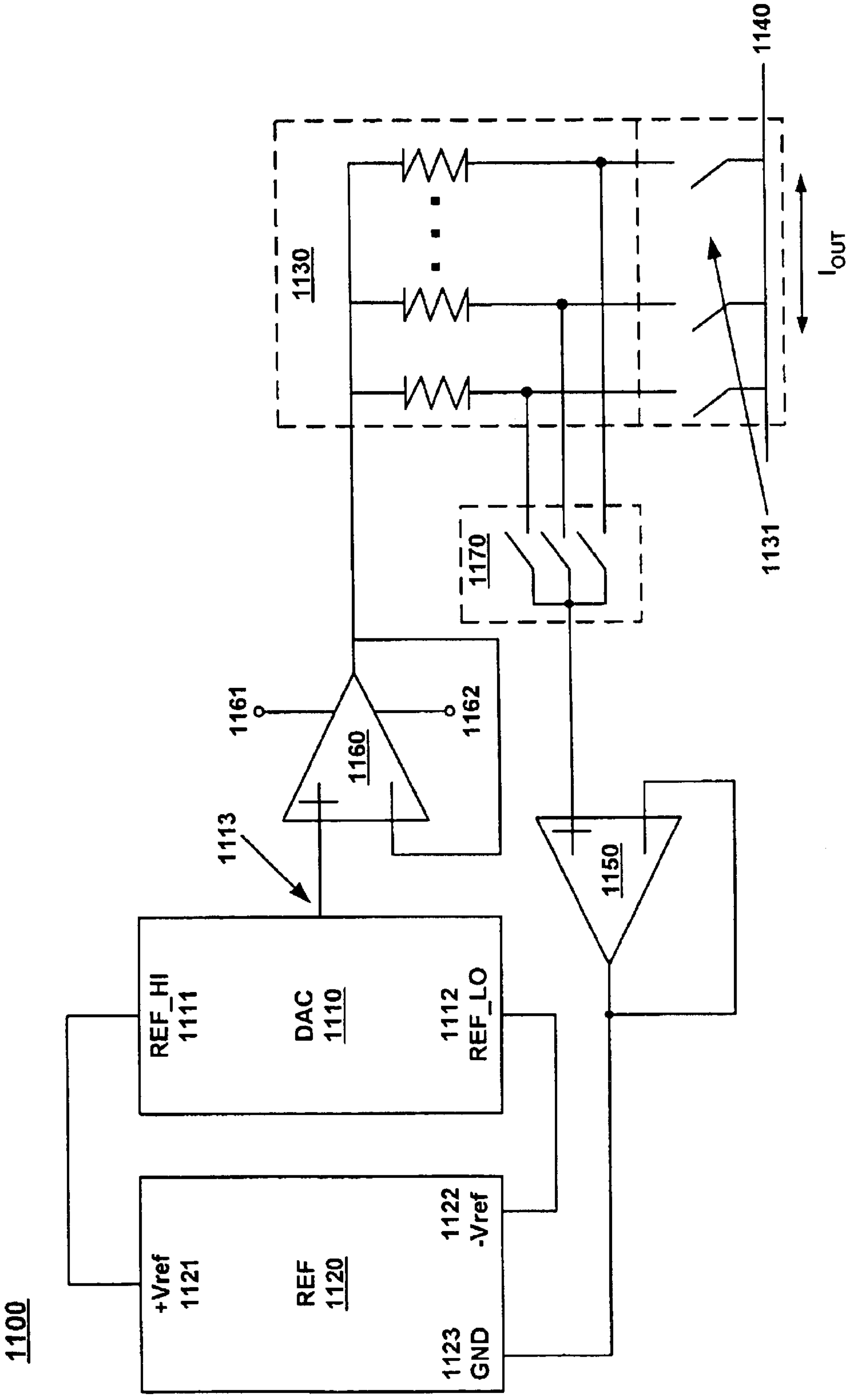
FIG. 11B is a diagram of another exemplary precision current sink/source with selectable ranges in accordance with embodiments of the present invention.

FIGS. 11A and 11B are diagrams of exemplary precision current sink/sources 1100 with selectable ranges in accordance with embodiments of the present invention. In FIG. 11A, a digital to analog converter 1110 is coupled with a voltage reference 1120. In one embodiment, a positive reference voltage is supplied to DAC 1110 by coupling a first output 1121 ($+V_{ref}$) with a first reference input 1111 (REF_HI) of DAC 1110. A negative reference voltage is supplied to DAC 1110 by coupling a second output 1122 ($-V_{ref}$) with a second reference input 1112 (REF_LO) of DAC 1110. In one embodiment of the present invention, a dual reference voltage source similar to that described in FIG. 10 may be utilized with precision current sink/source 1100.

In embodiments of the present invention, a multiplexor 1131 selectively couples the output 1113 of DAC 1110 with circuit output pin 1140 via a plurality of resistors 1130. This facilitates selecting different maximum values for the current source by switching the set voltage from DAC 1110 to a particular resistor. The maximum current range can then be controlled by selecting the resistor having the appropriate resistance value for that particular application rather than using the control bits of the DAC. In other words, the full resolution of the DAC is available because the resistors are used to set the maximum current. This allows controlling the maximum current without necessitating the lowering of the reference voltage or limiting the number of programming bits used by the DAC 1110.

Returning to FIG. 11A, a sensing device 1150 (e.g., feedback amplifier) is also coupled with circuit output pin 1140 and with a reference ground input 1123 (GND) of voltage reference 1120. The output voltage at circuit output pin 1140 is sensed by sensing device 1150 and is used to control the reference ground voltage of voltage reference 1120. Thus, as the output voltage at circuit output pin varies, the reference ground voltage of voltage reference 1120 is shifted as well. This in turn causes the positive reference voltage and the negative reference voltage to DAC 1110 to be similarly shifted.

In FIG. 11B, a second multiplexor 1170 selectively couples sensor 1150 to the output of resistors 1130. This is advantageous in a situation where the switch resistance is considered significant relative to the value of the resistor. For example, in a situation in which a large amount of current is driven, a significant voltage drop may be realized across the resistance of the switches coupling resistors 1130 with output pin 1140. In the embodiment of FIG. 11B, multiplexor 1170 selectively couples the output from the resistor directly to the non-inverting input to sensing device 1150. Because of the relatively larger impedance from sensing device 1150, relatively little current passes through multiplexor 1170. Also shown in the embodiment of FIG. 11B, is a buffer amp 1160 that is coupled between output 1113 of DAC 1110 and resistors 1130 to provide additional current using positive voltage supply input 1161 and negative voltage supply input 1162. In embodiments of the present invention, buffer amplifier 1160 may exhibit characteristics similar to those cited above in the discussion of buffer amplifier 760 of FIG. 7.

Figure 12:
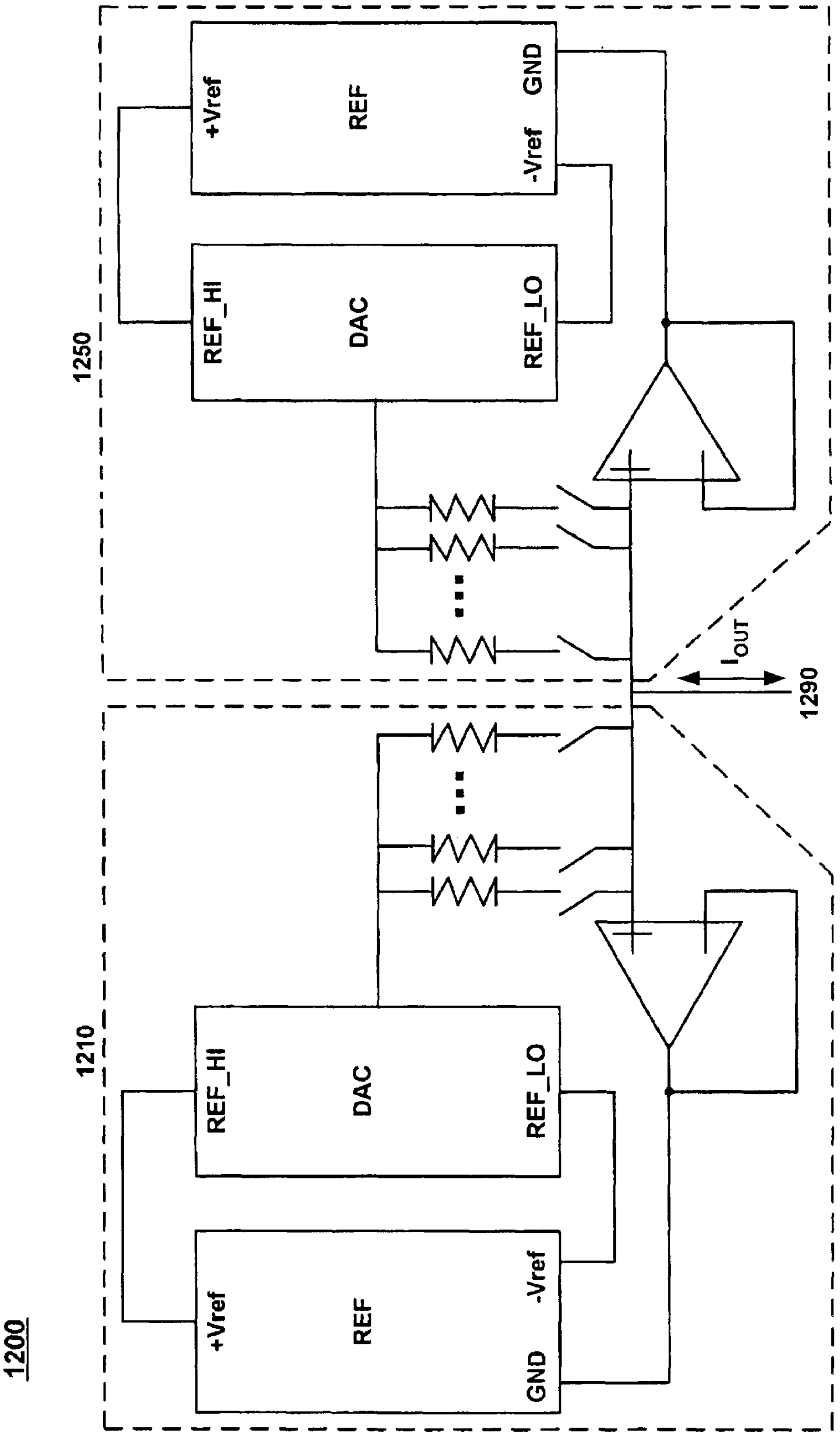
FIG. 12 is a diagram of an exemplary adaptive range precision current sink/source in accordance with embodiments of the present invention.

FIG. 12 is a diagram of an exemplary adaptive range precision current sink/source 1200 in accordance with embodiments of the present invention. In the embodiment of FIG. 12, two precision current sink/sources as described in FIG. 11A (e.g., precision sink/source 1210 and 1250 of FIG. 12) are coupled with a common circuit output pin 1290. Thus, the current at output pin 1290 can be expressed by the formula:

$$I_{out}=I_1+I_2$$

where $I_1$ is the current output by precision current sink/source 1210 and $I_2$ is the current output by precision current sink/source 1250. By having at least two precision current sink/sources coupled with a common output, enhanced resolution is realized over a wider dynamic range. For example, if precision current sink/sources 1210 and 1250 each utilize a 16-bit DAC, precision current sink/source 1200 effectively becomes a precision current sink/source with 32-bit resolution. In the embodiment of FIG. 12, the maximum current range for each of the precision current sink/sources (e.g., precision current sink/sources 1210 and 1250 of FIG. 12) is controlled by selecting a resistor having the appropriated resistance value. This allows controlling the maximum current without necessitating the lowering of the reference voltage or limiting the number of programming bits used by the DACs.

In the embodiment of FIG. 12, enhanced resolution is realized by setting the maximum current range of one precision current sink/source (e.g., precision current sink/source 1210) to a higher current range, while the second precision current sink/source (e.g., precision current sink/source 1250) is set to a lower current range. Thus, total current can be regulated in relatively coarse "steps" depending upon the programming bit input into the DAC of current sink/source 1210. Furthermore, the resolution is further enhanced by regulating the current in relatively "fine" steps using the DAC of current sink/source 1250.

For example, depending upon the selected resistance range, precision current sink/source 1210 may be configured so that each successive programming bit input into its DAC causes a 2 milli-amp (2 mA) change in current at output pin 1290. Precision current sink/source 1250 may be configured so that each successive programming bit input into its DAC causes a 2 micro-amp (2 $\mu$A) change in current at output pin 1290.

Having the ability to couple the output of two precision current sink/sources enables a system containing, for example, 2 precision current sink/sources to be configured either as 2 precision current sink/sources or as a single precision sinks/source with adaptive range. Adaptive range current sources can also be a cheaper alternative for achieving a specified resolution, since two low resolution DACs are cheaper than one DAC with very high resolution. When only a certain number of accurate settings are required, a point to point calibration scheme can be employed to attain the desired value.

In embodiments of the present invention, a current boosted precision current sink/source may be implemented by, for example, coupling buffers between the DACs and their respective resistors in a manner similar to that described in FIG. 7 if a higher current in needed. It is appreciated that embodiments of the present invention may couple two or more precision current sink/sources that are configured as shown in FIG. 11B.

The preferred embodiments of the present invention, programmable precision current controlling devices, are thus described. While the present invention has been described in particular embodiments, it should be appreciated that the present invention should not be construed as limited by such embodiments, but rather construed according to the following claims.

What is claimed is:

1. A circuit for controlling current comprising:

a digital to analog converter comprising a first input, a second input, and an output coupled with a circuit input/output pin;

a voltage source coupled to said digital to analog converter; and a sensing device coupled to said circuit input/output pin and coupled to said digital to analog converter.

2. The circuit of claim 1, wherein said sensing device comprises a first input coupled with said circuit input/output pin and a second input coupled to an output of said sensing device.

3. The circuit of claim 2 wherein said first input of said sensing device is a non-inverting input and said second input is an inverting input.

4. The circuit of claim 3, wherein said output of said sensing device is coupled to said second terminal of said digital to analog converter and to a reference input of said voltage source.

5. The circuit of claim 4, wherein a voltage output from said sensing device is used to control said voltage source and to control said digital to analog converter.

6. The circuit of claim 5, wherein said circuit comprises a current source circuit and wherein said voltage source provides a positive reference voltage to said digital to analog converter via said first input.

7. The circuit of claim 6 wherein said first input comprises a high reference voltage input of said digital to analog converter.

8. The circuit of claim 6 wherein said voltage from said sensing device is used as a reference low voltage of said voltage source and as a low reference of said digital to analog converter.

9. The circuit of claim 6 wherein said positive reference voltage, said reference low voltage, and said low reference voltage are changed in response to a change in said voltage output from said sensing device.

10. The circuit of claim 5 wherein said circuit comprises a current sink circuit and wherein said voltage source provides a negative reference voltage to said digital to analog converter via said first input.

11. The circuit of claim 10 wherein said first input comprises a low reference voltage input of said digital to analog converter.

12. The circuit of claim 10 wherein said voltage from said sensing device is used as a reference high voltage of said voltage source and as a high reference of said digital to analog converter.

13. The circuit of claim 10 wherein said negative reference voltage, said reference high voltage, and said high reference voltage are changed in response to a change in said voltage output from said sensing device.

14. A precision current sink/source circuit comprising:

a digital to analog converter coupled to a circuit input/output pin;

a dual reference voltage source coupled to said digital to analog converter; and a sensing device coupled to said circuit input/output pin and for controlling said reference voltage supply.

15. The precision current sink/source circuit of claim 14, wherein said dual reference voltage source provides a positive voltage to a first input of said digital to analog converter and a negative voltage to a second input of said digital to analog converter.

16. The precision current controller of claim 15, wherein said dual reference voltage source comprises:

a reference ground input coupled with said sensing device;

a first reference voltage source having a reference voltage terminal coupled with said first input of said digital to analog converter and a reference ground terminal coupled with said reference ground input of said reference voltage supply; and a second reference voltage source having a reference ground terminal coupled with said second input of said digital to analog converter and a reference voltage terminal coupled with said reference ground input of said dual reference voltage source.

17. The precision current sink/source circuit of claim 15, wherein a voltage from said sensing device is used as a reference voltage of said dual reference voltage source.

18. The precision current sink/source circuit of claim 17, wherein said positive voltage, said negative voltage, and said reference voltage are changed in response to a change in said voltage from said sensing device.

19. The precision current sink/source of claim 14 wherein said precision current sink/source further comprises:

a selectable resistive load coupling said digital to analog converter and said circuit input/output pin; and a device for selectively coupling said sensing device with said selectable resistive load.

20. The precision current sink/source of claim 19 further comprising:

a circuit input/output pin;

a second precision current sink/source coupled with said circuit input/output pin, said second precision current sink/source comprising:

a second digital to analog converter;

a second dual reference voltage source coupled to said second digital to analog converter;

a second selectable resistive load coupled to an output of said second digital to analog converter and to said circuit input/output pin;

a second sensing device coupled to said circuit input/output pin and coupled to an input of said second dual reference voltage source; and a second device for selectively coupling said second sensing device with said second selectable resistive load.

* * * * *